(12) United States Patent
Migunov et al.

(10) Patent No.: US 12,025,664 B2
(45) Date of Patent: Jul. 2, 2024

(54) MONITORING SYSTEM FOR A LOW VOLTAGE, MEDIUM VOLTAGE, OR HIGH VOLTAGE CIRCUIT BREAKER

(71) Applicant: ABB Schweiz AG, Baden (CH)

(72) Inventors: Vadim Migunov, Ladenburg (DE); Aydin Boyaci, Karlsruhe (DE); Adrian Hozoi, Mannheim (DE); Gianluca Cortinovis, Albino (IT)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/871,026

(22) Filed: Jul. 22, 2022

(65) Prior Publication Data
US 2023/0035067 A1 Feb. 2, 2023

(30) Foreign Application Priority Data

Jul. 27, 2021 (EP) .................................... 21187881

(51) Int. Cl.
*G01R 31/327* (2006.01)
*G01D 5/20* (2006.01)
(Continued)

(52) U.S. Cl.
CPC ............. *G01R 31/327* (2013.01); *G01D 5/20* (2013.01); *H01H 1/14* (2013.01); *H01H 3/32* (2013.01)

(58) Field of Classification Search
CPC ............. G01R 31/327; G01R 31/3271; G01R 31/3272; G01R 31/3274; G01R 31/3277;
(Continued)

(56) References Cited

U.S. PATENT DOCUMENTS 5,566,041 A * 10/1996 Rumfield ................. H01H 9/56
361/115
6,002,560 A * 12/1999 Nguyen ............... H01H 1/0015
361/115
(Continued)

FOREIGN PATENT DOCUMENTS

CN 103674508 B * 12/2017 ........... H01H 1/0015
CN 213398835 U 6/2021
(Continued)

OTHER PUBLICATIONS

European Patent Office, Extended European Search Report in European Patent Application No. 21187881.4, 11 pp. (dated Jan. 3, 2022).

*Primary Examiner* — Jermele M Hollington
*Assistant Examiner* — Taqi R Nasir
(74) *Attorney, Agent, or Firm* — Leydig, Voit & Mayer, Ltd.

(57) ABSTRACT

A monitoring system includes a frame, a fixed contact, a moveable contact, a drive mechanism, and a linkage mechanism, wherein the fixed contact is fixed in position with respect to the frame, and wherein the linkage mechanism is coupled to the drive and the moveable contact, and wherein activation of the drive is configured to move the linkage mechanism such that the moveable contact is moved towards or away from the fixed contact, and wherein the monitoring system comprises a sensor system having a position sensor and a processor, the position sensor configured to be positioned with respect to the frame and the linkage mechanism such that lateral movement of a part of the linkage mechanism generates at least one displacement signal; and the processor configured to convert the at least one displacement signal to a displacement movement of the moveable contact toward or away from the fixed contact.

12 Claims, 6 Drawing Sheets

(51) Int. Cl.
*H01H 1/14* (2006.01)
*H01H 3/32* (2006.01)

(58) Field of Classification Search
CPC .... G01R 31/333; G01R 31/3333; G01D 5/20; G01D 5/2073; H01H 1/14; H01H 3/32
See application file for complete search history.

(56) References Cited

U.S. PATENT DOCUMENTS

| | | | | |
|---|---|---|---|---|
| 6,023,404 | A * | 2/2000 | Marmonier | H01H 11/0062 361/14 |
| 8,785,797 | B2 * | 7/2014 | Cortinovis | H01H 33/904 200/337 |
| 8,842,407 | B2 * | 9/2014 | Cortinovis | H01R 13/504 361/115 |
| 8,890,011 | B2 * | 11/2014 | Cortinovis | H01H 33/666 200/293 |
| 8,952,826 | B2 * | 2/2015 | Leccia | H01H 33/6662 218/123 |
| 9,378,901 | B2 * | 6/2016 | Ashtekar | H01H 33/666 |
| 10,371,498 | B2 * | 8/2019 | Moser | G01D 5/2053 |
| 10,418,793 | B2 * | 9/2019 | Gasparini | H02B 11/24 |
| 10,585,149 | B2 * | 3/2020 | Qama | G06F 30/367 |
| 11,004,619 | B2 * | 5/2021 | Ashtekar | H01H 33/666 |
| 11,112,274 | B2 * | 9/2021 | Qama | G01D 5/2053 |
| 11,239,033 | B2 * | 2/2022 | Marinkovic | H01H 11/0062 |
| 11,293,744 | B2 * | 4/2022 | Bertini | G01B 7/003 |
| 11,545,312 | B2 * | 1/2023 | Rakus | H01H 71/525 |
| 2011/0155547 | A1 * | 6/2011 | Cortinovis | H01H 33/666 200/16 A |
| 2011/0155555 | A1 * | 6/2011 | Cortinovis | H01H 33/666 200/573 |
| 2012/0320487 | A1 * | 12/2012 | Cortinovis | H01R 13/504 361/115 |
| 2013/0043111 | A1 * | 2/2013 | Venkitachalam | H01H 71/04 200/329 |
| 2014/0138357 | A1 * | 5/2014 | Kasza | H01H 11/00 29/622 |
| 2017/0336192 | A1 * | 11/2017 | Moser | G01B 7/30 |
| 2018/0241183 | A1 * | 8/2018 | Gasparini | H02B 11/24 |
| 2019/0195963 | A1 * | 6/2019 | Qama | H05K 1/165 |
| 2020/0072643 | A1 * | 3/2020 | Qama | G01D 5/2053 |
| 2020/0194191 | A1 * | 6/2020 | Ashtekar | G01R 31/3333 |
| 2020/0203088 | A1 * | 6/2020 | Marinkovic | H01H 3/30 |
| 2020/0278190 | A1 * | 9/2020 | Bertini | G01D 5/2258 |
| 2021/0193402 | A1 * | 6/2021 | Rakus | H01H 71/46 |
| 2022/0020546 | A1 * | 1/2022 | Delbaere | H01H 47/32 |
| 2022/0020547 | A1 * | 1/2022 | Delbaere | G01R 31/3274 |
| 2022/0156586 | A1 * | 5/2022 | Amihai | G06N 3/08 |
| 2022/0165526 | A1 * | 5/2022 | Amihai | H01H 47/002 |
| 2022/0181856 | A1 * | 6/2022 | Gitzel | H02B 13/065 |
| 2022/0199341 | A1 * | 6/2022 | Choi | H01H 33/6642 |
| 2022/0206069 | A1 * | 6/2022 | Choi | H01H 1/0015 |
| 2022/0252667 | A1 * | 8/2022 | Orban | G01R 31/3278 |
| 2023/0033088 | A1 * | 2/2023 | Boyaci | G01R 31/3274 |
| 2023/0035067 | A1 * | 2/2023 | Migunov | H01H 1/14 |
| 2023/0035276 | A1 * | 2/2023 | Boyaci | G01R 31/3274 |

FOREIGN PATENT DOCUMENTS

| | | | | |
|---|---|---|---|---|
| CN | 213398835 | U * | 6/2021 | |
| CN | 113690105 | A * | 11/2021 | ......... H01H 11/0062 |
| CN | 110914644 | B * | 7/2022 | ............... G01B 7/30 |
| CN | 116136420 | A * | 5/2023 | ............. G01B 7/003 |
| DE | 102007019021 | A1 | 11/2007 | |
| DE | 102021210273 | A1 * | 3/2023 | ......... G01R 31/3274 |
| EP | 2549610 | A2 | 1/2013 | |
| EP | 2612338 | A1 | 7/2013 | |
| EP | 4124833 | A1 * | 2/2023 | .......... G01D 5/2046 |
| EP | 4124873 | A1 * | 2/2023 | ........... G01R 31/327 |
| EP | 4125106 | A1 * | 3/2023 | ............... G01D 5/20 |
| JP | 5618781 | B2 * | 11/2014 | |
| KR | 102531873 | B1 * | 5/2023 | |
| WO | WO 2012/030498 | A1 | 3/2012 | |
| WO | WO-2018224155 | A1 * | 12/2018 | ........... H01H 1/0015 |
| WO | WO-2020209507 | A1 * | 10/2020 | ......... G01R 31/3274 |
| WO | WO-2023041716 | A1 * | 3/2023 | ............... B60L 13/03 |

\* cited by examiner

MONITORING SYSTEM FOR A LOW VOLTAGE, MEDIUM VOLTAGE, OR HIGH VOLTAGE CIRCUIT BREAKER

CROSS-REFERENCE TO RELATED APPLICATIONS

This patent application claims priority to European Patent Application No. 21187881.4, filed on Jul. 27, 2021, which is incorporated herein in its entirety by reference.

FIELD OF THE DISCLOSURE

This present disclosure relates to a monitoring system for a low voltage, medium voltage or high voltage circuit breaker, and to a circuit breaker having such a monitoring system.

BACKGROUND OF THE INVENTION

The operating mechanism of a Circuit Breaker (CB) is one of the main subsystems prone to cause failure of a switchgear. Most of the mechanical failures occurring in the mechanism can be detected by monitoring the travel curve that represents the position of the moving contact during opening or closing operations. Furthermore, the travel curve can also reveal electrical failure modes like contact ablation.

Today, travel curve monitoring is rarely applied in switchgears mainly due to the drawbacks of the existing solutions:
 a. Most of the today's travel curve monitoring solutions are based on recalculating the measured angular position of the main shaft into the position of the moving contacts by kinematical relationships representing multiple contact poles. Such a solution cannot however differentiate between travel curves of the different poles. Thus, the location of the failure is difficult to identify in situation when it occurs for a specific pole.
 b. In most CBs, the push rod is the preferred measurement location for the travel curve. This sets high requirements on the geometry of the sensor and the required electrical components for connection that have to fit in a very limited installation space. Therefore, only few position sensor solutions come into consideration.
 c. The commonly used position sensors require mechanical interfacing (contact) of position sensors such as potentiometers or encoders to the movable parts. Therefore, the sensors must withstand high impact-like forces due to the switching operations and the resulting shock vibrations. The mechanical failure of the sensor or its support in such a case can cause jamming of the CB mechanism and its failure. Also, the sensor should reliably measure the travel curve during the whole CB lifetime, which is then difficult to achieve.

Typically, the drawbacks listed above are characteristic for position sensors applicable for travel curve measurements in CBs and can only be mitigated by selecting high-end solutions. This however results in much higher cost, making permanent installation unattractive.

BRIEF SUMMARY OF THE INVENTION

Therefore, it would be advantageous to have an improved technique to monitor a low voltage, medium voltage, or high voltage circuit breaker.

In one aspect, the present disclosure describes a monitoring system for a low voltage, medium voltage or high voltage circuit breaker. Such a circuit breaker to which the monitoring system can be fitted comprises a frame, a fixed contact, a moveable contact, a drive mechanism, and a linkage mechanism. This circuit breaker is then laid out such that the fixed contact is fixed in position with respect to the frame, and the linkage mechanism is coupled to the drive and the moveable contact, and activation of the drive is configured to move the linkage mechanism such that the moveable contact is moved towards or away from the fixed contact. The monitoring system that can be fitted to such a circuit breaker then comprises: a sensor system.

The sensor system comprises a position sensor. The sensor system also comprises a processor. The position sensor is configured to be positioned with respect to the frame and the linkage mechanism such that lateral movement of a part of the linkage mechanism generates at least one displacement signal. Thus there is an air gap adjacent to the position sensor, and lateral movement means that the movement is perpendicular to the air gap such that the size of the air gap does not generally vary, except through vibrations for example. The processor is configured to convert the at least one displacement signal to a displacement movement of the moveable contact toward or away from the fixed contact.

BRIEF DESCRIPTION OF THE SEVERAL VIEWS OF THE DRAWING(S)

Exemplary embodiments will be described in the following with reference to the following drawings.

Figure 6A:
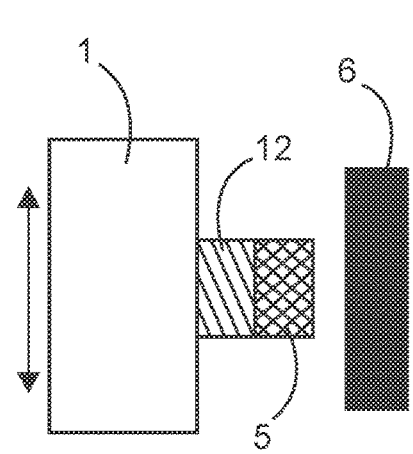
Figure 6B:
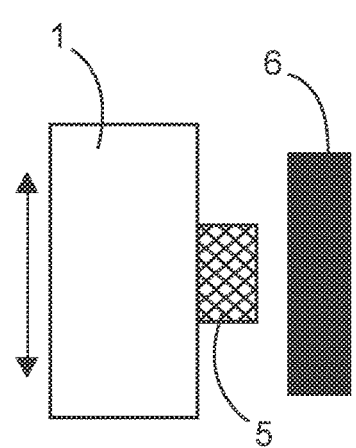
Figure 6C:

FIGS. 6a, 6b, and 6c show three examples of parts of a sensor system showing a position sensor and a target or detector part in accordance with the disclosure.

FIGS. 7a-7f show six exemplar locations of the position sensor of the sensor system with respect to a linkage mechanism of the circuit breaker in accordance with the disclosure.

Figure 8A:
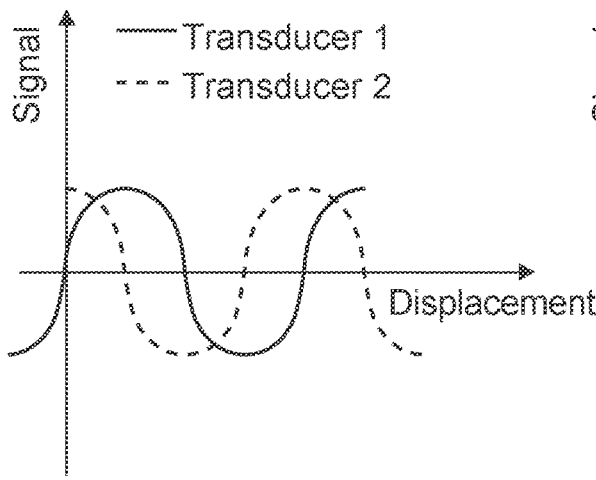
Figure 8B:
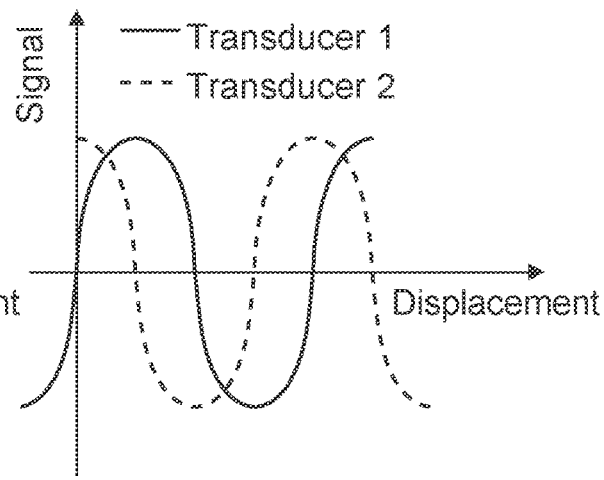

FIGS. 8a and 8b show two examples of the sensor signals coming from two different receivers, which could be from one transducer of two transducers, shown different signal magnitudes in accordance with the disclosure.

Figure 9A:
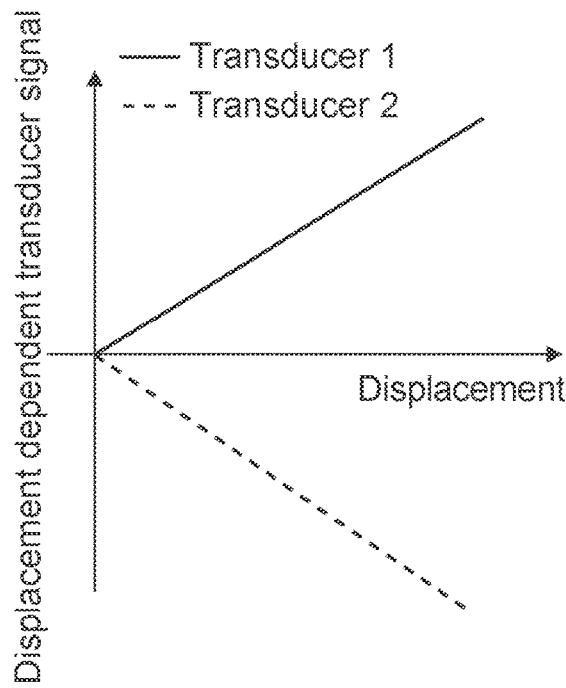
Figure 9B:
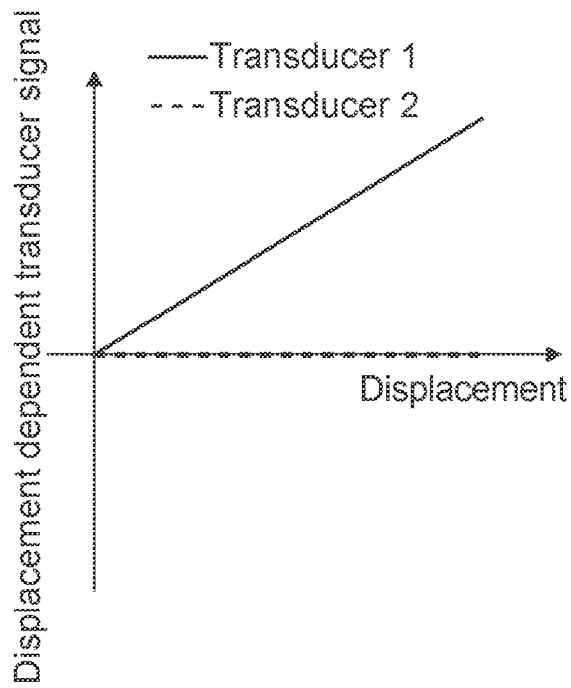

FIGS. 9a and 9b show two examples of displacement dependent transducer signals in accordance with the disclosure.

Figure 10:
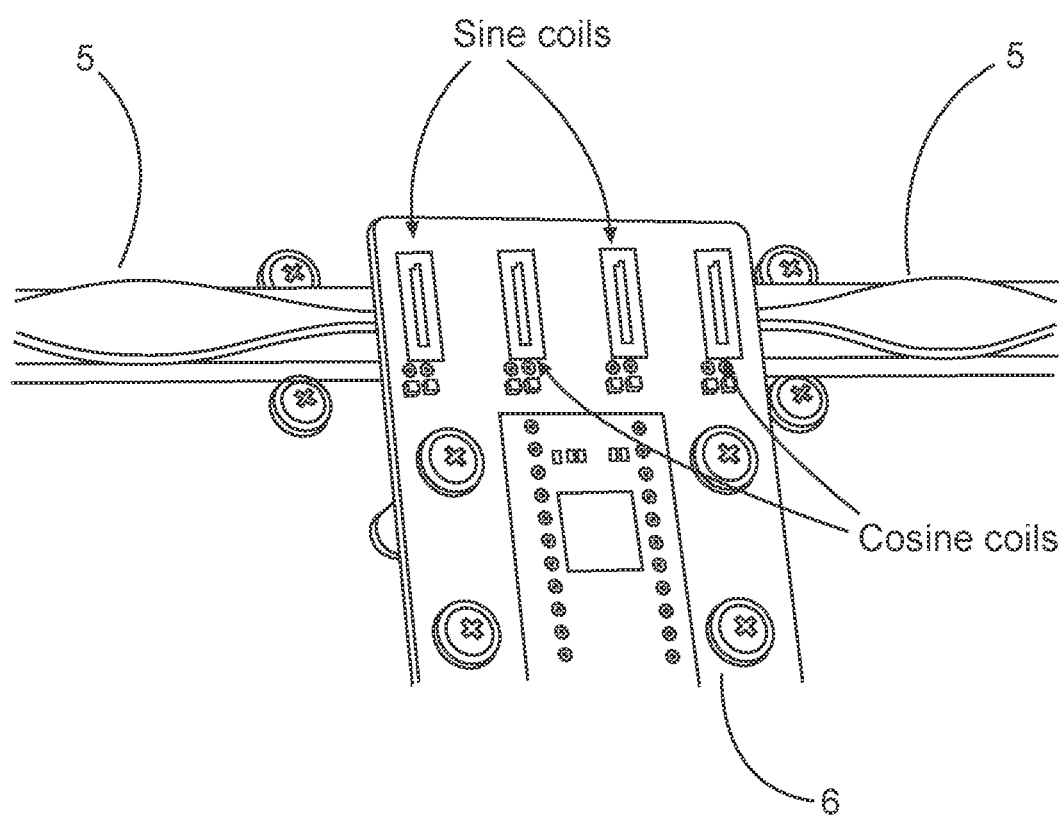

FIG. 10 shows a position sensor with four receiver coils, mounted to a frame of the circuit breaker, positioned over a target or detector part that itself is mounted to a linkage mechanism of the circuit breaker, where the specific "sinusoid envelope" shape of the target or detector partition, in accordance with the disclosure.

DETAILED DESCRIPTION OF THE INVENTION

FIGS. 1-10 relate to a monitoring system for a low voltage, medium voltage or high voltage circuit breaker.

In an example a monitoring system for a low voltage, medium voltage or high voltage circuit breaker can be retrofitted to an existing circuit breaker or be integrally manufactured with the circuit breaker. Such a circuit breaker comprises a frame or housing 9, a fixed contact 13, a moveable contact 14, a drive mechanism 15, and a linkage mechanism 1, 1a, 1b, 1c, 2, 3. The fixed contact is fixed in position with respect to the frame, and the linkage mechanism is coupled to the drive and the moveable contact. Activation of the drive is configured to move the linkage mechanism such that the moveable contact is moved towards or away from the fixed contact. The monitoring system comprises a sensor system 5, 6, 18. The sensor system comprises a position sensor 6. The sensor system also comprises a processor 18, which could be incorporated within the position sensor itself or external to the position sensor. The processor is not shown as such in the figures. The position sensor is configured to be positioned with respect to the frame and the linkage mechanism such that lateral movement of a part of the linkage mechanism generates at least one displacement signal. The processor is configured to convert the at least one displacement signal to a displacement movement of the moveable contact toward or away from the fixed contact.

In an example, prior calibration is utilized in converting the at least one displacement signal to the displacement movement of the moveable contact toward the fixed contact.

Thus, it can be determined from the displacement signal how much the part of the linkage mechanism has worked. Prior calibration has correlated movement of this part of the linkage mechanism with the movement of the moveable contact as a result of activation of the drive. In other words, as the drive activates, different parts of the linkage mechanism move in certain directions and by certain amounts and there is also a certain movement of moveable contact. Thus, movement of the linkage mechanism, determined from the sensor system, and be transformed into a movement of the moveable contact.

In an example, the drive mechanism comprises a shaft 15.

In an example, the linkage mechanism comprises one or more levers 1.

In an example, the linkage mechanism comprises a plurality of levers 1, 1a, 1b, 1c.

In an example, one of the levers is connected to the drive shaft.

In an example, one of the levers is connected to the frame.

In an example, the linkage mechanism comprises a pushrod 3.

In an example, the pushrod is connected to the moveable contact.

In an example, a first lever is connected to the shaft such that it rotates with the shaft, and one or more further levers and connected between this lever and the frame. Each of these further levers can rotate around a joint 2 with the adjoining lever and the lever attached to the frame can rotate with respect to the frame around a joint 17. The pushrod is then connected to one of the levers around a joint. Thus, as the drive activates the shaft rotates and the whole lever mechanism moves and the lever to which the pushrod is connected moves such that the pushrod is pushed in the direction of the fixed contact to move the moveable contact towards the fixed contact. The drive can then activate to rotate the shaft in the opposite direction, and move the moveable contact away from the fixed contact.

According to an example, the position sensor is configured to be mounted to a part of the frame spaced from the part of the linkage system. The lateral movement of the part of the linkage system with respect to the position sensor is configured to generate the at least one displacement signal.

According to an example, the position sensor comprises an inductive transducer.

According to an example, the inductive transducer comprises at least one transmitter and a first receiver and a second receiver. The first receiver is configured to generate a first displacement signal of the at least one displacement signal and the second receiver is configured to generate a second displacement signal of the at least one displacement signal.

According to an example, the first receiver and second receiver are configured and/or located such that the first displacement signal is different to the second displacement signal.

According to an example, the first displacement signal varies in an opposite manner to the second displacement signal.

According to an example, the first receiver has a sinusoidal coil shape along a length of the transducer and the second receiver has a cosine coil shape along the length of the transducer.

According to an example, the at least one transmitter is one transmitter associated with both the first receiver and the second receiver.

According to an example, the first receiver is located at substantially the same position as the second receiver.

According to an example, the sensor system comprises a target or detector part 5 configured to be mounted to the part of the linkage system such that it is spaced from the position sensor. The lateral movement of the part of the linkage mechanism then lead to a corresponding lateral movement of the target or detector part. The lateral movement of the target or detector part with respect to the position sensor then generates the at least one displacement signal.

According to an example, a first part of the target or detector part has a first shape and a second part of the target or detector part has a second shape different to the first shape. The first receiver is offset spatially from the second receiver, and the lateral movement of the target or detector part is configured to move the first part of the target or detector part over the first receiver and at the same time move the second part of the target or detector part over the second receiver.

In an example the two receivers are side by side perpendicular to the lateral movement direction and each interact with completely different parts of the target or detector part that are shaped different.

In an example, the two receivers are side by side, but can be spaced apart, but aligned in the lateral movement direction, such that first one receiver would pass over a part of the target and then the second receiver would pass over the same part of the target if the lateral movement of the part of the linkage system to which the target is attached is large enough. But the target is shaped in the direction of the lateral movement direction such that at any point in time each receiver interacts with a different shape of the target.

According to an example, the first part of the target or detector part has a sinusoidal shape and the second part of the target or detector part has a cosine shape.

According to an example, the at least one transmitter comprises a first transmitter associated with the first receiver and a second transmitter associated with the second receiver.

According to an example, the position sensor is configured to be mounted to a part of the linkage system spaced from the frame, and the lateral movement of the part of the linkage system is configured to result in a corresponding lateral movement of the position sensor. The lateral movement of the position sensor with respect to the frame then generates the at least one displacement signal.

In an example, the position sensor comprises an inductive transducer.

In an example, the inductive transducer comprises at least one transmitter and a first receiver and a second receiver. The first receiver is configured to generate a first displacement signal of the at least one displacement signal and the second receiver is configured to generate a second displacement signal of the at least one displacement signal.

In an example, the first receiver and second receiver are configured and/or located such that the first displacement signal is different to the second displacement signal.

In an example, the first displacement signal varies in an opposite manner to the second displacement signal.

Here, reference to opposite manner means that as one signal is increasing in amplitude the other signal is decreasing in amplitude In an example, the first receiver has a sinusoidal coil shape along a length of the transducer and the second receiver has a cosine coil shape along the length of the transducer.

In an example, the at least one transmitter is one transmitter associated with both the first receiver and the second receiver.

In an example, the first receiver is located at substantially the same position as the second receiver.

In an example, the sensor system comprises a target or detector part 5 configured to be mounted to the frame such that it is spaced from the position sensor. The lateral movement of the position sensor with respect to the target or detector part then generates the at least one displacement signal.

In an example, a first part of the target or detector part has a first shape and a second part of the target or detector part has a second shape different to the first shape. The first receiver is offset spatially from the second receiver. The lateral movement of the position sensor is configured to move the first receiver over the first part of the target or detector part and at the same time move the second receiver over the second part of the target or detector part.

In an example, the first part of the target or detector part has a sinusoidal shape and the second part of the target or detector part has a cosine shape.

In an example, the at least one transmitter comprises a first transmitter associated with the first receiver and a second transmitter associated with the second receiver.

Thus, a new contact travel curve monitoring technique using a new sensor system has been developed for use in the development of strategies for predictive maintenance and fault detection of electrical circuit breakers (CBs). Prior to this new development existing techniques required measurement of position using mechanical interfacing of position sensors like potentiometers or encoders.

In an specific embodiment of the new technique the new technique utilizes Eddy currents induced in the breaker parts or in a target attached to it for detection of their position with high precision in sub-mm range. This is done using an inductive transmitter and receiver circuits with differential signal processing making the position sensor immune to vibrations and electromagnetic interference. The solution allows contactless position sensing of the moving contact, which is beneficial for reliability of the whole system and offers possibility of retrofitting the monitoring system into existing CBs. The simple and space-efficient design of the position monitoring device allows its integration even in smaller CBs with lower current ratings.

Here the new technique in effect involves modifying a circuit breaker by attaching inductive position sensors to its frame. The sensors are mounted in close vicinity (for example 0.2-20 mm air gap) of the moving parts acting on movable contact of the breaker in order to measure travel of the contact. The position sensing should be done on a conducting part of the linkage, which is in this case can be ideally a part of the breaker (e.g. lever of linkage) or a dedicated conducting (e.g. aluminum) plate which is attached to the breaker part of interest directly (for example a push rod or lever of linkage). The sensor can for example consist of a transmission and of two opposite receiver coils that react in a different way to position change of a target but in the same way to the change of the separation (air gap). With such a design it is possible to achieve compensation of the effect of vibrations which is an important issue for contactless sensors applied in a circuit breaker as well as achieve rejection of electromagnetic noise, which is common for applications inside switchgears. The sensor assembly can be built from low-cost electronic components. The transmitter and receiver coils can be printed directly on a PCB. The sensor signal processing can be done in an integrated circuit and the output signal can be easily tailored according to the requirements of the switchgear relay input. The benefits of the solution can be summarized as follows:

a. Linear position sensing allows direct measurement of travel curve for each pole and therefore more precise identification of failure type and location.

b. Compact design allows easy installation of the sensors and offers possibility for retrofitting.

c. Contactless position sensing results in drastic increase of sensor reliability and minimizes the chance of the CB failure due to mechanical fault of the sensor or its support.

In brief summary the complete electrical switch arrangement, with the monitoring system, comprises:
1. a frame (e.g. breaker housing with all static assembly).
2. at least one fixed contact.
3. at least one moving contact assembly (e.g. including contact spring).
4. operating mechanism acting on the moving contact assembly through a linkage mechanism.
5. at least one fixed (with respect to the frame) sensor
   a. sensor is configured to sense a displacement of a detectable part of the linkage mechanism where the sensed displacement is representative of the displacement of at least a part of the moving contact assembly.
   b. air gap/separation is provided between the sensor and the detectable part such that the sensor is not in contract with the linkage mechanism, where the separation is orthogonal to the displacement.
   c. sensor comprises at least a transducer which provides a signal depending on the separation between the transducer and the detectable part and on the displacement of the detectable part.

A number of specific detailed embodiments are now described, where reference is again made to FIGS. 1-10.

Figure 1:
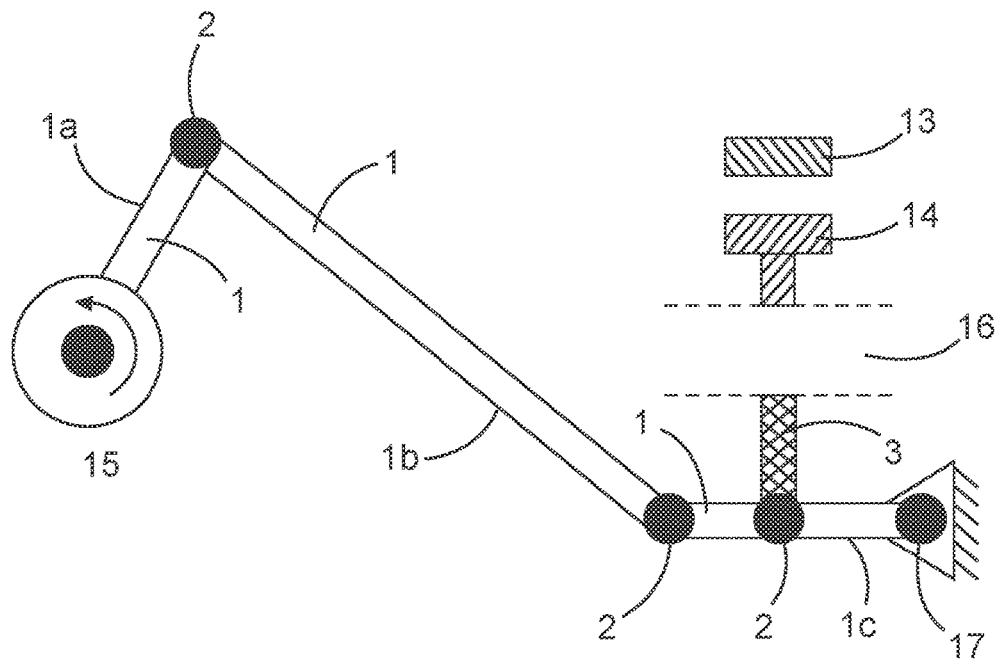
FIG. 1 shows an example of a monitoring system for a low-voltage, medium voltage, or high voltage circuit breaker in accordance with the disclosure.

FIG. 1 shows an example of a monitoring system for a low-voltage, medium voltage, or high voltage circuit breaker. Here, side view schematics of the kinematic chain of a circuit breaker are shown. One out of typically three sub-mechanisms (linkage) corresponding to a single electric phase is shown. Shown at 1 are levers (linkage), 1a, 1b, and 1c, with lever joints 2 between the levers. There is also a joint 17 at a pivot point, attached to the frame 9. A main shaft 15 that is a drive mechanism can rotate and lever 1a rotates with it, and levers 1b and 1c move. A pushrod 3, which is part of the breaker mechanism is connected to lever 1c by a lever joint 2, and there is a contact connecting assembling 16 between the pushrod and the movable contact 14. As the main shaft rotates anticlockwise, lever 1c rotates clockwise and the pushrod 3 moves vertically, and as the movable contact 14 moves with the pushrod, the movable contact 14 is moved towards and ultimately contacts the fixed contact 13. The main shaft can rotate in the opposite direction to move the movable contact 14 away from the fixed contact 13, alternatively another mechanism such as a spring based system (not shown) can move the movable contact away from the fixed contact.

Figure 2:
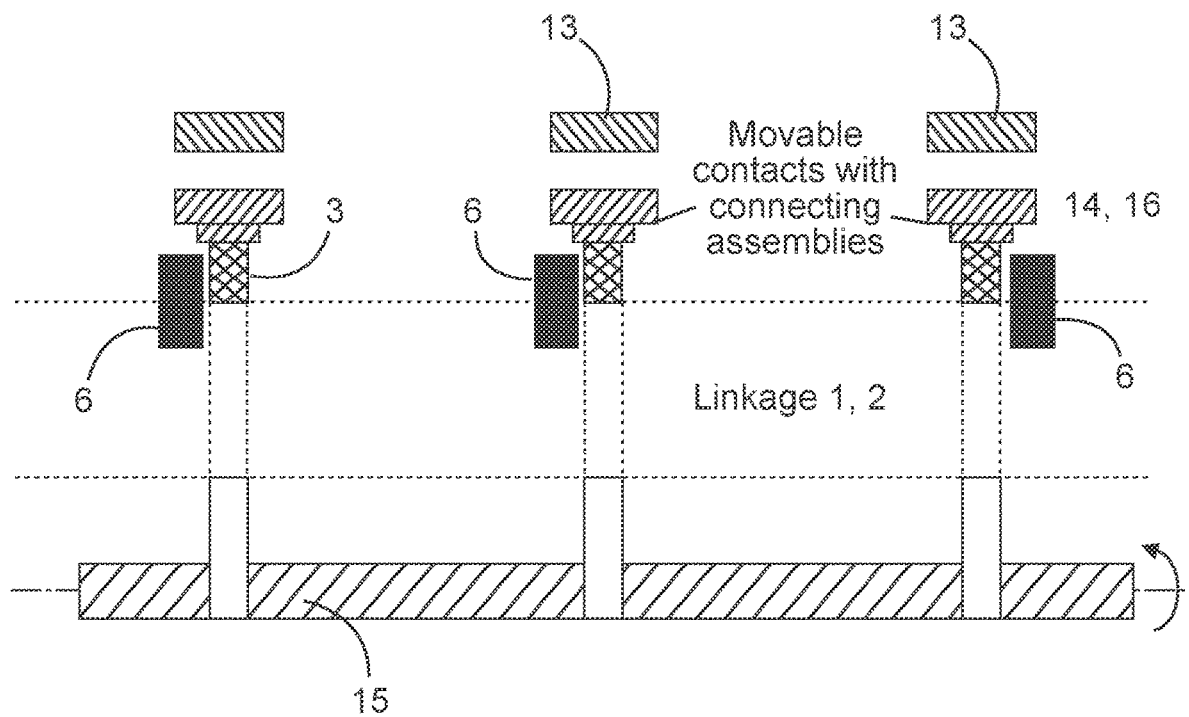
FIG. 2 shows an example of three example monitoring systems for a low-voltage, medium voltage, or high voltage circuit breaker each applied to a different circuit breaker pole of, for example, a 3 phase system, where a single main shaft is utilized but different shafts could be utilized, in accordance with the disclosure.

FIG. 2 shows an example of three example monitoring systems for a low-voltage, medium voltage, or high voltage circuit breaker each applied to a different circuit breaker pole offer example a three phase system. Here, front view schematics of the electrical contacts and linkage assemblies with a possible location of sensing elements is shown. Each of the three moving contact assemblies is equipped with its own sensing element.

Figure 3:
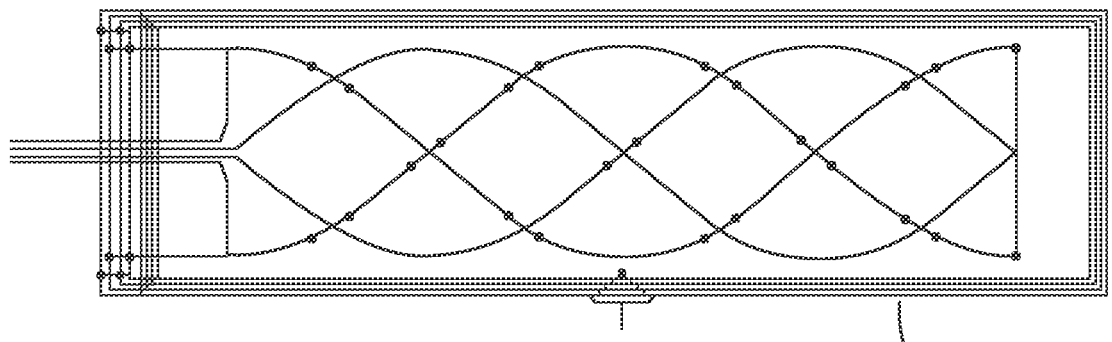
FIG. 3 shows an example of a position sensor in accordance with the disclosure.

FIG. 3 shows an example of a position sensor. Specifically an inductive position sensor coil arrangement 6 is shown. The outer rectangular coil is a transmitter, and the sine and cosine shaped coils inside transmitter act as receivers.

Figure 4:
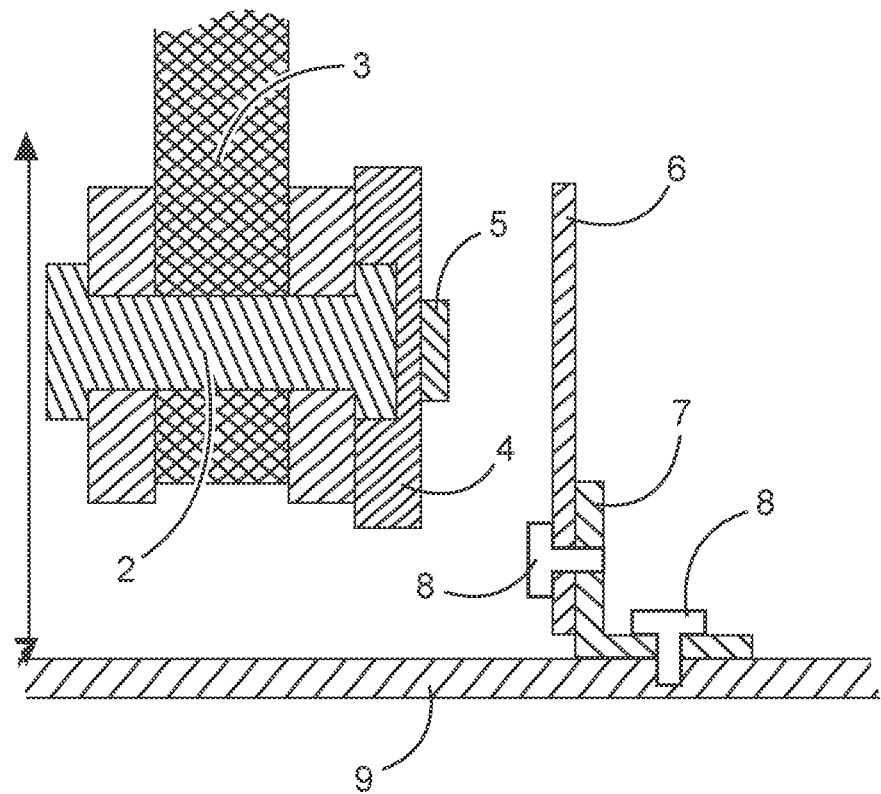
FIG. 4 shows an example of parts of a sensor system showing a position sensor and a target or detector part, shown with respect to parts of a linkage mechanism of the circuit breaker in accordance with the disclosure.

FIG. 4 shows an example of parts of a sensor system showing a position sensor and a target or detector part, shown with respect to parts of a linkage mechanism of the circuit breaker. Here, specifically a front view schematic cut of a part of a circuit breaker mechanism 1 with attached detectable target or detector part 5 and a sensing element or position sensor 6 attached to a frame 9 is shown. A target housing 4 allows precise alignment of the target 5 with respect to the lever mechanisms 1 and push rod 3 through the fitting for the joint bolt 2. The Sensing element 6 is attached to the frame 9 using an angle bracket 7 and two screws 8.

Figure 5A:
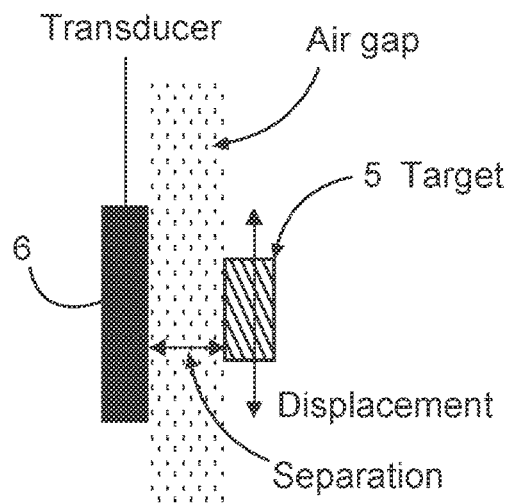
FIG. 5a and FIG. 5b show, respectively, front and side views of an example of parts of a sensor system showing a position sensor and a target or detector part in accordance with the disclosure.
Figure 5B:
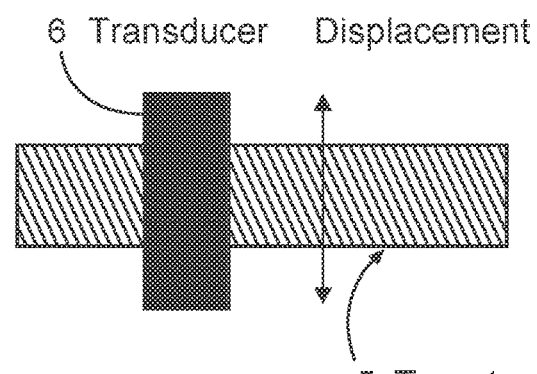

FIGS. 5a and 5b show front and side views of an example of parts of a sensor system showing a position sensor and a target or detector part. Here are shown at FIG. 5a a front view of arrangement of the sensor 6 and the target 5, and at FIG. 5b a side view of the sensor-target arrangement is shown.

FIGS. 6a-c show three examples of parts of a sensor system showing a position sensor and a target or detector part. Specifically here are shown front view schematics of possible circuit breaker mechanisms and sensing elements. At FIG. 6a is shown an assembly consisting of (conducting) mechanical lever 1, (possibly, but not necessarily, insulating) spacer 12, and conducting target 5 as detectable part of the linkage 1, 3. At FIG. 6b is shown an assembly consisting of (possibly, but not necessarily, insulating) mechanical lever 1 and conducting target 5 as detectable part of the linkage 1, 3. At FIG. 6c is shown a sensing element or position sensor 6 applied directly to conducting lever acting as detectable part.

FIGS. 7a-7f show an exemplar locations of the position sensor of the sensor system with respect to a linkage mechanism of the circuit breaker. These are possible locations of the sensor element (position sensor) with respect to breaker mechanism representing position of the moving contact, but the position sensor can be located at other locations of the linkage mechanism.

FIGS. 8a and 8b show examples of the sensor signals coming from two different receivers, which could be from one transducer of two transducers, shown different signal magnitudes. Here two sensor transducer (1 and 2) have output signals (proportional to cosine and sine of the displacement respectively). As shown there are different magnitude of signals in panels shown in FIG. 8a and FIG. 8b that correspond to different separations of target and sensor. However, the relative position of the curves remains the same enabling an accurate determination of lateral displacement orthogonal to these separation changes (e.g. air gap changing due to vibration etc.) to be made.

FIGS. 9a and 9b show examples of displacement dependent transducer signal. Here it is shown that the two sensor transducer signals with displacement dependent parts have different dependency on the displacement at FIG. 9a or no dependency at all at FIG. 9b.

FIG. 10 shows a position sensor with four receiver coils, mounted to a frame of the circuit breaker, positioned over a target or detector part that itself is mounted to a linkage mechanism of the circuit breaker, where the specific "sinusoid envelope" shape of the target or detector partition. Thus this shows an inductive position sensor with a modulated target and the inductive position sensor has a four resonant coil arrangement. Each coil acts as a receiver and transmitter simultaneously.

As detailed above, the new technique provides a condition monitoring solution within a circuit breaker based on contact travel measurement of individual poles through a contactless sensor which is immune to vibrations and stray electromagnetic fields. This is fulfilled through an electrical switch (circuit breaker) arrangement for example a three phase switchgear with a three-pole circuit breaker, or for a single-pole circuit breaker and one monitoring system, or a dual-pole circuit breaker and two monitoring systems. Thus, for a three circuit breaker system the new arrangement comprises:

Three current interrupters with one fixed and one moving contact each. The three pairs of contacts in three circuit breakers correspond to three electrical phases (see FIG. 2). The current interrupters can for example be vacuum interrupters, but need not necessarily be vacuum interrupters.

A circuit breaker mechanism comprising of three moving contact assemblies (one per interrupter including contact springs), three contact pushrods acting on the contact assembly, three linkage mechanism (set of levers), linking each pushrod to a main shaft (see FIGS. 1-2). The role of the switch mechanism is to open or close an electrical circuit through connecting or separating the movable contact and the fixed contact. The main shaft is driven by an actuator that could be spring- or electromagnetically driven.

A frame, serving as a support of the parts of the switch mechanism. In particular serving as an attachment point of the interrupters and thereby of a fixed contact. It also serves as protection of the breaker assembly and of an operator.

Three inductive position sensors (one per moving contact) consisting of one transmitter coil and two receiver coils (see FIG. 3). (Generally single sensor can also be used.) Each of the sensors is attached to a housing using an angle bracket, and it is set to sense the position of a conducting target attached to a lever fixed by a joint with a pushrod (see FIG. 4). Precise positioning of the sensor is important for measurement precision. The target is attached using or example a non-conducting housing which is clipped onto the lever and has a fitting for a bolt of a pushrod-lever joint (see FIG. 4). Such a fitting allows to precisely define the position of the target which has an important effect on the measurement precision.

Some important features of the sensors are the following:

Air gap/separation is provided between the sensor and the target such that the sensor is not in physical contract with any of the movable parts, where the separation is orthogonal to the displacement (see FIGS. 5a and 5b). This is an important feature of the sensor which makes it contactless and therefore does not require mechanical interfacing of the sensor to any of the moving parts.

The sensor utilizes inductive position sensing principle. I.e. it has transmitter coil (transducer). The coil can be driven with an alternating current which induces so called Eddy currents in a conducting target placed in a closed vicinity to it. The Eddy currents in the target change response of the other two transducers (two receiver coils) and due to receiver coils shaped in the form of sine and cosine the response is proportional to sine and cosine of the position of the target. Therefore, the position of the target can be measured with high precision.

In addition to that the three-transducer arrangement of the sensor offers two further advantages: the receiver signals can be extracted using a known frequency of the transmitter signal, which results in higher signal-to-noise ratio and more importantly in ultimate rejection of signals induced by external electromagnetic fields; the signals of the receiver coils can be processed in a quasi-differential way in order that the total level of the signals (which depends on both separation of the target and lateral position of the target) does not play a role in position calculation, resulting in ultimate rejection of the effect of transversal vibrations that changes the separation between the sensor and the target.

The optimal monitoring solution involves sensing of the position of the contact directly or at the moving parts representing position of the contact situated as close as possible to the contact itself. Therefore, there are several possibilities where and how the sensing element can be mounted and if a dedicated target attached to the moving part will be required (see FIGS. 6a-6c and FIGS. 7a-7f):

Sensing of the push rod position. The pushrod is typically made from an insulating material therefore a conducting target needs to be attached to a pushrod (FIGS. 6b and 7e).

Figure 7A:
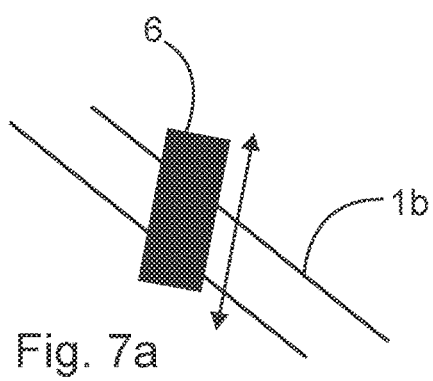
Figure 7B:
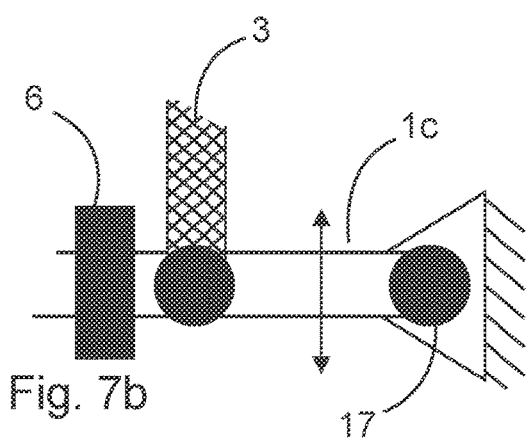
Figure 7C:
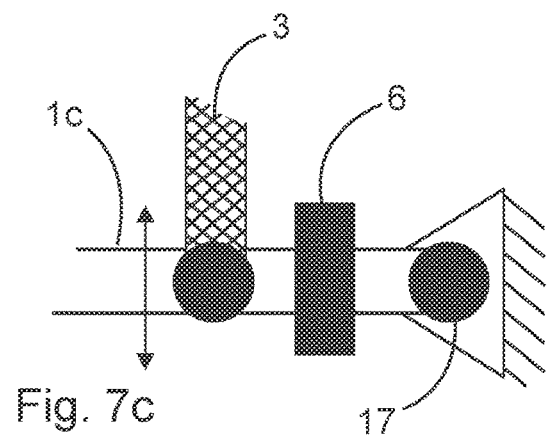
Figure 7D:
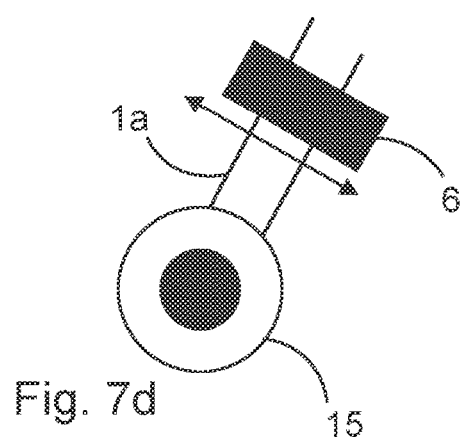
Figure 7E:
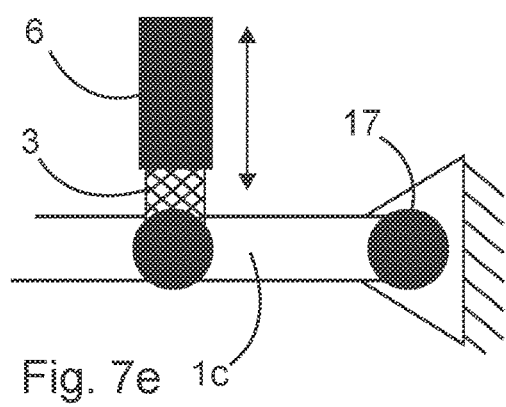
Figure 7F:
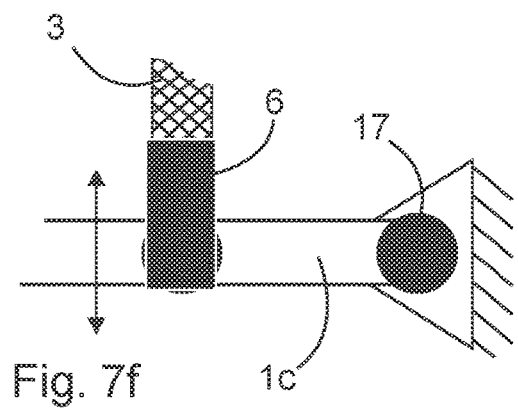

Sensing of the horizontal lever position with a dedicated target attached to it using a non-conducting spacer or target housing assembly (FIGS. 6a and 7b-c)

Sensing position of the levers without a target attached (here the levers that are made from conducting material serve as targets; FIG. 6c, 7a-d).

In all the cases except where the position sensing is done either on the push rod directly or on a joint of the pushrod and horizontal lever (see FIG. 7e-f), the sensed position is recalculated into a position of the pushrod knowing the geometry of the kinematic chain of the linkage. (Also, in all the cases the nature of motion can also be taken into consideration, i.e. linear or arch motion. For different cases different shapes of transmitter and receiver coils can be used.) Sensing of the position of a lever without a target attached has advantages of easier mounting of the sensor inside the circuit breaker (providing an ability to retrofit) and it requires less parts in the assembly which makes the solution more cost-efficient. In the cases when a target is required the precise positioning of the target with respect to the lever is important in order to achieve high accuracy of the travel curve measurement via the structures (fittings) for the alignment (e.g. ones shown in FIG. 4).

Another feature of consideration is the selection of the inductive position sensing element. The position sensor provides for efficient rejection of strong transient electromagnetic fields which arise during the switching as well as to be insensitive to the vibrations which change the air gap between the sensor and the target. The first one can be achieved using receiver transducers (coils) and a differential measurement scheme where the signal induced by the electromagnetic field of the breaker is induced in both transducers in the same way and can be canceled out when the signals are processed. In addition to that locking the receiver signal to the frequency of the transmitter adds additional robustness since all other signals with frequencies that don't match the transmitter frequency will be rejected. Similarly, the insensitivity to the vibrations relies on the shape of the coils which produce a signal proportional to sine or cosine of the displacement. In this case, the position can be calculated as an angle between the two signals. The change in the air gap affects the magnitude but not the angle of the signals and therefore such an arrangement is robust against vibrations.

Generally, the separation change compensation can also be realized using two or more transducers that produce the same signal upon the change of separation but different signals upon change of the displacement or vice versa. For example (see FIG. 9a), here the signal of transducer 1 S1 is a linear combination of signals proportional to displacement d and to the separation t, and the signal of transducer 1 S2 is a linear combination of signals proportional to displacement d opposite to that of S1 and a signal proportional to the separation t with the same coefficient. Then the difference of the two transducer signals results in subtraction of the separation dependent part and doubling of the displacement dependent part:

$$S_1 - S_2 = (kd + lt) - (-kd + lt) = 2kd$$

Thus, the effect of vibrations leading to a change in separation, or indeed an offset change in separation with displacement that affects both transducer equally, has been mitigated.

Also, the modulation of the receiver signal can be done by either shaping the transducer coils (like sine or cosine shaped coils described above and shown in FIG. 3) or by shaping the target and using rectangular or round coils (see FIG. 10). As shown in FIG. 10 the target or detector part that the coils interact with has a sinusoidal like shape that goes from a narrow waist to a maximum and back to a narrow waist in a sine-wave like manner. The example in FIG. 10 shows that various arrangements of transducer coils is possible. General rule is that at least two transducers are required for the compensation of the effects mentioned above. Here two transducer can mean one transmitter and two receivers or two transmitters and two receivers.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the present disclosure, displacement signal is a term used to indicate that a signal is generated due to the lateral movement. This displacement signal generated due to movement of a part of the linkage mechanism can then be utilized to generate in effect information relating to movement of that part of the linkage mechanism. Calibration information can then be utilized that correlates the displacement signal, due to movement of the part of the linkage mechanism, with movement of the moveable contact.

Thus, for example during a calibration procedure the drive can be activated such that the linkage mechanism moves to drive the moveable contact from a start fully open position to an end position where the moveable contact contacts the fixed contact. The calibration displacement signal due to movement of a part of the linkage mechanism is acquired and at the same time the calibration displacement movement of the moveable contact towards the fixed contact is acquired. This correlation between the calibration displacement signal and the calibration displacement movement information is then stored. This could be done for the actual system or for a calibration system, or even be acquired through modelling. Then, when the drive operates and a displacement signal is generated the correlation can be utilized to convert this displacement signal into a corresponding displacement movement of the moveable contact. Thus, it is known where the moveable contact is in terms of its spacing from the fixed contact, and in effect the moveable contact travel curve can be generated. The above discussion also applies when the moveable contact is in contact with the fixed contact, and where a correlation of displacement signal with displacement movement can be generated that can then be used to determine the position of the moveable contact with respect to the fixed contact as the drive operates to move the moveable contact away from the fixed contact.

In this manner, a contact travel measurement for the moveable contact of a circuit breaker is provided through a non-contact sensing mechanism, which is immune to vibrations and astray electromagnetic fields, providing for a new and effective circuit breaker monitoring solution.

In an example, the position sensor is configured to be mounted to a part of the frame spaced from the part of the linkage system, and the lateral movement of the part of the linkage system with respect to the position sensor is configured to generate the at least one displacement signal.

Thus, by having the position sensor mounted to the frame, the effect of vibrations and the forces generated on the linkage system during activation on the sensor itself are minimized and/or mitigated.

In an example, the position sensor comprises an inductive transducer.

In an example, the inductive transducer comprises at least one transmitter and a first receiver and a second receiver. The first receiver is configured to generate a first displacement signal of the at least one displacement signal and the second receiver is configured to generate a second displacement signal of the at least one displacement signal.

In an example, the first receiver and second receiver are configured and/or located such that the first displacement signal is different to the second displacement signal.

In an example, the first displacement signal varies in an opposite manner to the second displacement signal.

In an example, the first receiver has a sinusoidal coil shape along a length of the transducer and the second receiver has a cosine coil shape along the length of the transducer.

In other words, as the part of the linkage system passes over the transducer it will interact with the sinusoidal shape receiver and with the cosine shaped receiver at the same time. Thus, for example the displacement signal can look like a sine wave from one receiver and at the same time like a cosine wave for the second receiver, the displacement can be very accurately determined. And, indeed the signals can be subtracted one from the other as part of the analysis, enabling any signal change due to a movement of the transducer perpendicularly toward or away from the part of the linkage mechanism, changing the air gap in a direction perpendicular to the lateral movement, a change in signal affects both receivers and thus effect that can be caused by vibrations can be mitigated.

In an example, the at least one transmitter is one transmitter associated with both the first receiver and the second receiver.

In an example, the first receiver is located at substantially the same position as the second receiver.

Thus, by generating two displacement signals in this manner, the lateral displacement of the part of the linkage system can be very accurately determined and at the same time effect of vibrations can be minimised.

In an example, the sensor system comprises a target or detector part configured to be mounted to the part of the linkage system such that it is spaced from the position sensor. The lateral movement of the part of the linkage mechanism is then configured to lead to a corresponding lateral movement of the target or detector part. The lateral movement of the target or detector part with respect to the position sensor is configured to generate the at least one displacement signal.

By having a target or detector part, this part made from metal can be mounted to insulating parts of the linkage system, and the target part can be made to increase the signal and indeed generate a displacement signal in an advantageous manner.

In an example, a first part of the target or detector part has a first shape and a second part of the target or detector part has a second shape different to the first shape. The first receiver is offset spatially from the second receiver. The lateral movement of the target or detector part is configured to move the first part of the target or detector part over the first receiver and at the same time move the second part of the target or detector part over the second receiver.

In an example, the first part of the target or detector part has a sinusoidal shape and the second part of the target or detector part has a cosine shape.

In other words, the target in the lateral movement direction can narrow to a waist and then go to a maximum and then narrow to a waist again, and in effect be a sinusoidal envelope, where one side of the target has a sinusoidal shape, mirrored on the other side by the same sinusoidal shape.

One receiver can then be at a start position at the waist for example, and the other receiver can be at a start position of a maximum. Then with a lateral movement of the target the receiver signal from the receiver that was at the waist will increase similar to a sine wave signal and the receiver signal from the receiver that was at the maximum will decrease similar to a cosine wave signal.

Thus, for example the displacement signal can look like a sine wave from one receiver and at the same time like a cosine wave for the second receiver, the displacement can be very accurately determined. And, indeed the signals can be subtracted one from the other as part of the analysis, enabling any signal change due to a movement of the transducer perpendicularly toward or away from the part of the linkage mechanism, changing the air gap in a direction perpendicular to the lateral movement, a change in signal affects both receivers and thus effect that can be caused by vibrations can be mitigated.

In an example, the at least one transmitter comprises a first transmitter associated with the first receiver and a second transmitter associated with the second receiver.

In an example, the position sensor is configured to be mounted to a part of the linkage system spaced from the frame. The lateral movement of the part of the linkage system is configured to result in a corresponding lateral movement of the position sensor, and the lateral movement of the position sensor with respect to the frame is configured to generate the at least one displacement signal.

In other words, it is generally preferable to mount the position sensor to the frame, but in certain situations it can be more convenient to mount the position sensor to the linkage mechanism.

In a second aspect, there is provided a low voltage, medium voltage or high voltage circuit breaker comprising a monitoring system according to the first aspect.

The above aspects and examples will become apparent from and be elucidated with reference to the embodiments described hereinafter.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A monitoring system for a low voltage, medium voltage or high voltage circuit breaker, the circuit breaker comprising:
   a frame;
   a fixed contact;
   a moveable contact;
   a drive mechanism; and
   a linkage mechanism;
   wherein the fixed contact is fixed in position, and wherein the linkage mechanism is coupled to the drive mechanism and the moveable contact, and wherein activation of the drive mechanism is configured to move the linkage mechanism such that the moveable contact is moved towards or away from the fixed contact;
   wherein the monitoring system comprises a sensor system, the sensor system including a position sensor and a processor, and wherein the position sensor comprises an inductive transducer;
   wherein the position sensor is configured to be positioned with respect to the frame and the linkage mechanism such that lateral movement of a part of the linkage mechanism generates at least one displacement signal, wherein the position sensor is configured to be mounted to a part of the frame spaced from the part of the linkage mechanism, and wherein the lateral movement of the part of the linkage mechanism with respect to the position sensor is configured to generate the at least one displacement signal, and wherein the inductive transducer comprises at least one transmitter and a first receiver and a second receiver, wherein the first receiver is configured to generate a first displacement signal of the at least one displacement signal and the second receiver is configured to generate a second displacement signal of the at least one displacement signal;
   wherein the processor is configured to convert the at least one displacement signal to a displacement movement of the moveable contact toward or away from the fixed contact; and
   wherein the sensor system comprises a target or detector part configured to be mounted to the part of the linkage mechanism such that it is spaced from the position sensor, wherein lateral movement of the part of the linkage mechanism is configured to lead to a corresponding lateral movement of the target or detector part, and wherein lateral movement of the target or detector part with respect to the position sensor is configured to generate the at least one displacement signal.

2. The monitoring system according to claim 1, wherein the first receiver and second receiver are configured and/or located such that the first displacement signal is different to the second displacement signal.

3. The monitoring system according to claim 2, wherein the first displacement signal varies in an opposite manner to the second displacement signal.

4. The monitoring system according to claim 1, wherein the first receiver has a sinusoidal coil shape along a length of the transducer and the second receiver has a cosine coil shape along the length of the transducer.

5. The monitoring system according to claim 4, wherein the at least one transmitter is one transmitter associated with both the first receiver and the second receiver.

6. The monitoring system according to claim 4, wherein the first receiver is located at substantially the same position as the second receiver.

7. The monitoring system according to claim 1, wherein a first part of the target or detector part has a first shape and a second part of the target or detector part has a second shape different to the first shape, wherein the first receiver is offset spatially from the second receiver, and wherein the lateral movement of the target or detector part is configured to move the first part of the target or detector part over the first receiver and at the same time move the second part of the target or detector part over the second receiver.

8. The monitoring system according to claim 7, wherein the first part of the target or detector part has a sinusoidal shape and the second part of the target or detector part has a cosine shape.

9. The monitoring system according to claim 1, wherein the at least one transmitter comprises a first transmitter associated with the first receiver and a second transmitter associated with the second receiver.

10. The monitoring system according to claim 1, wherein the position sensor is configured to be mounted to a part of the linkage mechanism spaced from the frame, and wherein the lateral movement of the part of the linkage mechanism is configured to result in a corresponding lateral movement of the position sensor, and wherein the lateral movement of the position sensor with respect to the frame is configured to generate the at least one displacement signal.

11. The monitoring system according to claim 1, wherein the position sensor is further configured to be positioned orthogonally with respect to the lateral movement of the part of the linkage mechanism.

12. The monitoring system according to claim 1, wherein the processor is further configured to convert the at least one displacement signal to the displacement movement based on a predetermined frequency of the at least one displacement signal.

* * * * *